United States Patent [19]

Previti-Kelly

[11] Patent Number: 5,006,488

[45] Date of Patent: Apr. 9, 1991

[54] HIGH TEMPERATURE LIFT-OFF PROCESS

[75] Inventor: Rosemary A. Previti-Kelly, Richmond, Vt.

[73] Assignee: International Business Machines Corporation, Armonk, N.Y.

[21] Appl. No.: 417,935

[22] Filed: Oct. 6, 1989

[51] Int. Cl.⁵ .................... H01L 21/312; H01L 21/47
[52] U.S. Cl. .................... 437/229; 437/944; 148/DIG. 100; 148/DIG. 75
[58] Field of Search .................... 437/944, 229; 148/DIG. 100, DIG. 75

[56] References Cited

U.S. PATENT DOCUMENTS

| Re. 30,186 | 1/1980 | Rubner et al. | 430/325 |
|---|---|---|---|
| 3,934,057 | 1/1976 | Moreau et al. | 427/43 |
| 4,040,831 | 8/1977 | Rubner | 96/35.1 |
| 4,087,569 | 5/1978 | Hatzakis | 427/43 |
| 4,428,796 | 1/1984 | Milgram | 156/637 |
| 4,451,971 | 6/1984 | Milgram | 29/578 |
| 4,542,090 | 9/1985 | Lewis | 430/296 |
| 4,606,998 | 8/1986 | Clodgo et al. | 430/312 |
| 4,645,734 | 2/1987 | Takada et al. | 430/315 |
| 4,659,650 | 4/1987 | Moritz et al. | 437/944 |
| 4,741,988 | 5/1988 | Van der Zande et al. | 430/283 |
| 4,777,119 | 10/1988 | Brault et al. | 430/296 |
| 4,786,569 | 11/1988 | Rohde et al. | 430/14 |
| 4,877,718 | 10/1989 | Moore et al. | 430/326 |
| 4,886,573 | 12/1989 | Watanabe et al. | 437/944 |
| 4,886,734 | 12/1989 | Moore et al. | 430/326 |

FOREIGN PATENT DOCUMENTS

| 0055015 | 3/1984 | Japan | 437/944 |
|---|---|---|---|
| 0004221 | 1/1985 | Japan | 437/944 |
| 0247948 | 12/1985 | Japan | 437/944 |

OTHER PUBLICATIONS

Homma, Y. et al., "Polyimide Lift-Off Technology for High-Density LSI Metallization", IEEE Transactions on Electron Devices, vol. Ed. -28, No. 5 (May 1981), pp. 552-556.

Frary, J. M. et al., "Lift-Off Techniques for Fine Line Metal Patterning", Semiconductor International (Dec. 1981), pp. 72-85.

Rohde, O. et al., "High Resolution, High Photospeed Polyimide for Thick Film Applications", Solid State Technology (Sep. 1986).

Primary Examiner—Brian E. Hearn
Assistant Examiner—Trung Dang
Attorney, Agent, or Firm—William D. Sabo

[57] ABSTRACT

Disclosed is a process for forming a pattern of metallization on a processed semiconductor substrate, under high temperature conditions, employing a polyimide precursor material as a lift-off layer. Advantageously, the material is photosensitive, and, after exposure and development, the portions of the layer remaining on the substrate can be completely and readily removed with conventional solvents.

10 Claims, 4 Drawing Sheets

HIGH TEMPERATURE LIFT-OFF PROCESS

BACKGROUND OF THE INVENTION

1. Technical Field

This invention relates to a process for forming a pattern of conductive material on a substrate, and more particularly, to an improved lift-off process for forming a pattern of metallization under high temperature conditions.

2. Description of the Prior Art

Lift-off techniques are commonly employed in forming a pattern of metallization on a processed semiconductor substrate. One approach involves coating a photoresist layer on a substrate, and then patterning the layer through a photomask. A metal layer is then formed on the patterned photoresist, which is subsequently lifted-off, taking with it the undesired portions of the metal layer. See, for example, U.S. Pat. No. 3,934,057, issued to Moreau, et al., on Jan. 20, 1976. One drawback to this type of process, however, is that the metal layer must be deposited at a relatively low temperature, due to the relatively poor heat resistance of the photoresist materials typically employed. This is undesirable as it degrades the electrical characteristics of the devices and lowers the yield of the metallization pattern.

To overcome this problem, processes have been developed, in which polyimide films are employed as the lift-off layer. See, in general, Frary, J. M., et al., "Lift-Off Techniques For Fine Line Metal Patterning", Semiconductor International (Dec. 1981), pp. 72–85. See also, Homma, Y., et al., "Polyimide Lift-Off Technology For High-Density LSI Metallization", IEEE Transactions On Electron Devices, Vol. Ed.-28, No. 5 (May 1981), pp. 552–556, which uses a heat-resistant polyimide (available from Hitachi Chemical Co., Ltd., under the trademark "PIQ") in a high temperature metal deposition process.

At high temperatures, however, the polyimide materials become generally insoluble, and thus not completely and readily removable with commonly used solvents. As a result, rather cumbersome and complex removal processes have been devised. See, for example, U.S. Pat. No. 4,428,796, issued to Milgram on Jan. 31, 1984, which discloses a process for removing a polyimide from a semiconductor substrate by heating it to a temperature of 450°–490° C. and immersing the substrate in a solution of methylene chloride or ethylene diamine/hydrazine, followed by ultrasoneration.

Further, a barrier layer is generally required in order to protect the polyimide during the photolithographic process. In U.S. Pat. No. 4,451,971, issued to Milgram on Jun. 5, 1984, for example, a select polyimide layer is applied to a semiconductor substrate. A barrier layer is deposited on the polyimide, and these layers are patterned using a photoresist mask. A metal layer is deposited, and the polyimide is then stripped, lifting off the undesired portions of metal.

A process which seeks to eliminate the need for a barrier layer is disclosed in U.S. Pat. No. 4,606,998, issued to Clodgo, et al. on Aug. 19, 1986. In that patent, a first polyimide layer is applied to a substrate, followed by application of a high temperature polyimide layer. After the two polyimide layers are etched through a photoresist mask, a metal layer is applied; and then, the high temperature polyimide layer is lifted off, the first polyimide layer remaining as a passivation layer. While satisfactory in some respects, this process still requires the use of a photoresist and involves a number of photolithographic steps, which, for cost reduction, would be desirable to reduce.

Thus, for a variety of reasons, none of the techniques described above has proven to be entirely satisfactory.

SUMMARY OF THE INVENTION

It is against this background that the present invention provides an improved lift-off process. In accordance with the invention, a layer of photosensitive polyimide precursor is first applied to a processed semiconductor substrate. Portions of the substrate are uncovered by imagewise exposing and then developing the layer. A film of conductive material is formed on the portions of the layer remaining on the substrate and the uncovered portions of the substrate under high temperature conditions. The remaining portions of the layer and the portions of the film which overlie such portions are then lifted off.

In the practice of the invention, a pattern of conductive material is formed on a processed semiconductor substrate, without the use of a separate photoresist layer, since the polyimide precursor material itself is photosensitive. Consequently, the number of overall process steps is reduced, because no image transfer steps are required. In addition, the need for a barrier layer to protect the polyimide precursor material is avoided. Further, the remaining portions of the material on the substrate are readily removed or lifted off with a conventional solvent.

DETAILED DESCRIPTION

Figure 1:
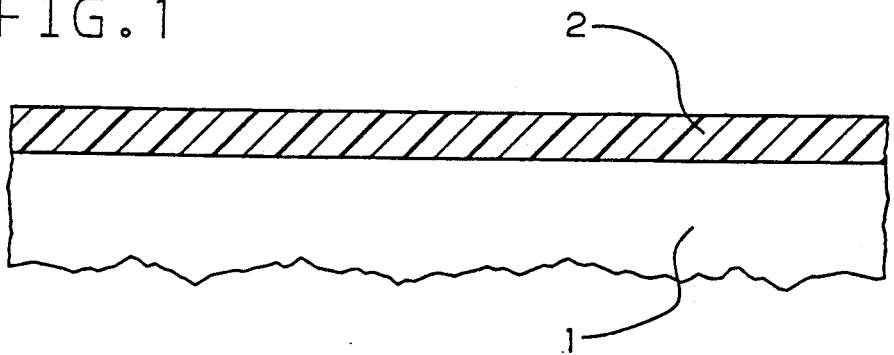
FIGS. 1–4 are cross-sectional views of a semiconductor structure illustrating the structure that results at various stages of the process of the present invention.

Referring to FIG. 1, the process starts by applying a layer of photosensitive polyimide precursor 2 to a processed semiconductor substrate 1. Preferably, the layer is spin applied at about 1000–3000 RPM for about 15–45 seconds, and then baked at a temperature of about 70°–120° C. for about 10–30 minutes. Actual conditions will vary, however, depending on a number of factors, such as, for example, the desired thickness of the layer 2, the exact precursor material employed, and so forth, as will be apparent to those skilled in the art. In general, the layer 2 is applied to a thickness greater than about 15μ, and typically ranging from about 15 to 30μ.

It should be noted that the substrate may include active and passive electronic devices (e.g., FET or bipolar transistors, storage capacitors, resistors, etc.), layers of electrically conducting material or other desired regions, and that the pattern of conductive material may be formed so as to provide an electrical contact to any of these structures or regions.

In accordance with the invention, any suitable photosensitive polyimide precursor material may be employed. Preferably, the material is a photosensitive polyimide precursor which fully imidizes at a temperature in excess of the temperature at which the film of conductive material is formed, more preferably at least about 250°–280° C., and is capable of forming a layer having a thickness which is greater than that of the film of conductive material, more preferably at least about 25% greater than that of the film.

In a particularly preferred embodiment, the polyimide precursor material is a methacrylate ester of an amine and anhydride, such as that commercially available under the designation "PROBIMIDE 348" by Ciba-Geigy Corp. and having the formula

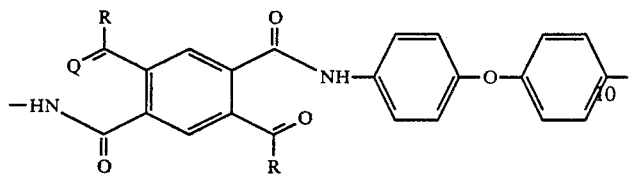

where R is

Such polyimide precursor materials are described more fully in Rohde, O., et al., "High Resolution, High Photospeed Polyimide For Thick Film Applications", Solid State Technology (Sep. 1986), the entire disclosure of which is incorporated herein by reference. Other suitable polyimide precursor materials are disclosed in Re. 30,186, issued to Rubner, et al. on Jan. 8, 1980; U.S. Pat. No. 4,040,831, issued to Rubner, et al. on Aug. 9, 1977; and U.S. Pat. No. 4,786,569, issued to Rohde, et al. on Nov. 22, 1988, the entire disclosures of which are also incorporated herein by reference.

Figure 2:
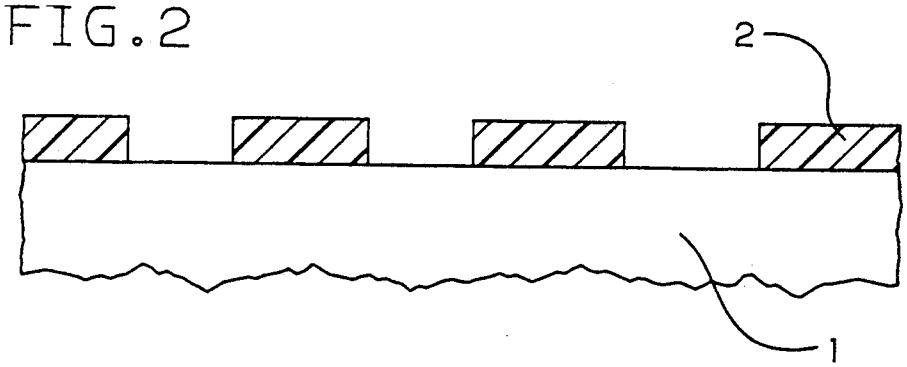

Referring to FIG. 2, the layer 2 is exposed in a predetermined pattern to radiation, such as UV light, in a conventional fashion. Following the exposure step, portions of the layer 2 are removed to uncover portions of the substrate 1. For example, when a negative acting polyimide precursor is employed, the unexposed portions of the layer 2 are removed. Preferably, the substrate 1 is immersed in a conventional developer, such as, for example, xylene/butyrolactone. In general, the development time will depend on the thickness of the layer 2, as well as other factors known to those skilled in the art. Next, a baking step is usually performed in order to drive off the developer, preferably at a temperature in excess of that at which the conductive material is deposited.

Figure 3:
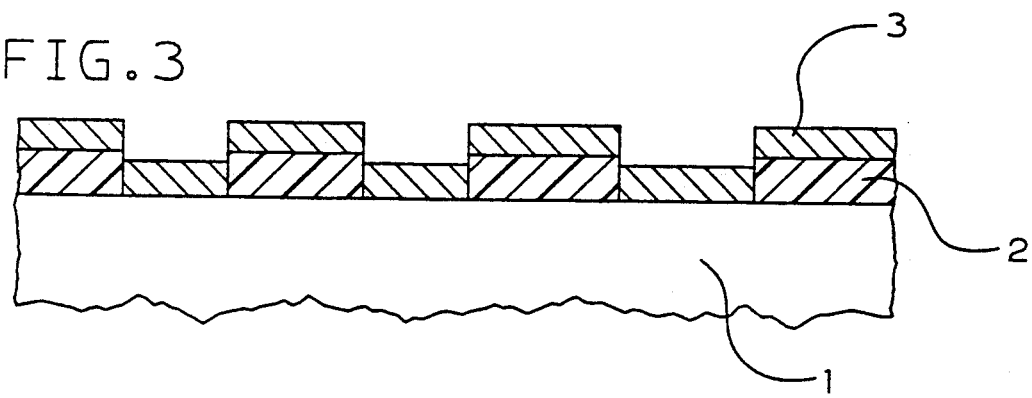

Referring to FIG. 3, a film 3 of conductive material is then formed on the portions of the layer 2 remaining on the substrate and the uncovered portions of the substrate 1 under high temperature conditions. Preferably, the film 3 of conductive material is a metal film (e.g., Al, Cu, Cr, etc. or combinations of metals, preferably Cr/Al/Cr/Cu/Au), which is deposited by evaporation at a temperature in the range from about 150° C. to about 250° C., more preferably in the range from about 165° to about 200° C. The film 3 preferably has a thickness of about 12-18μ.

Figure 4:
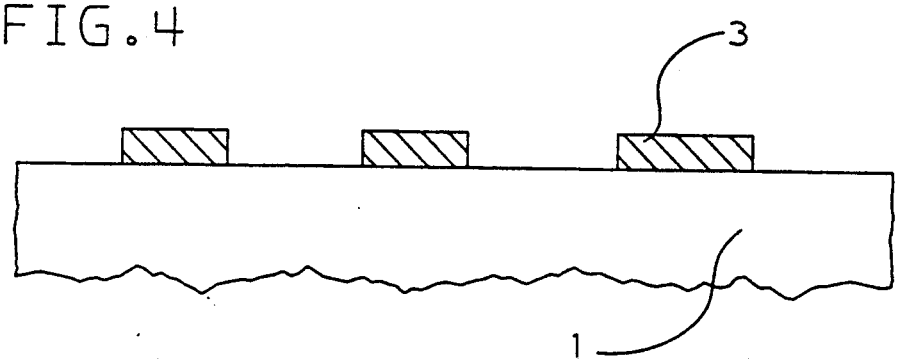

Finally, as shown in FIG. 4, the remaining portions of the layer 2 and the portions of the film 3 which overlie the remaining portions of the layer 2 are lifted-off the substrate 1. Preferably, this is accomplished by immersing the substrate 1 in a solvent, such as n-methyl pyrrolidone at about 70°-90° C. for about 1-3 hours preferably with agitation, such as with N₂ bubbling. It should be noted that since the polyimide precursor material does not fully imidize at the temperatures at which the conductive material is deposited, an insoluble material is not formed. Thus, the remaining portions of the layer can be completely and readily removed from the substrate 1. This results in a structure in which a desired pattern of conductive material or metallization remains on the substrate 1.

As such, the process of the invention provides the resulting structure without requiring the use of a photoresist with accompanying image transfer steps or a barrier layer to protect the lift-off layer. Since the lift-off process utilizes fewer steps, the overall process is cheaper and simpler to use in manufacturing.

In a typical application of the invention, a semiconductor structure was fabricated by: spin application of 20μ thick photosensitive polyimide precursor ("PROBIMIDE 348") and baking at a temperature of less than 110° C. The "PROBIMIDE 348" material was exposed to a dose of 360 mJ/cm² at 438 nm using a mercury lamp. The image was developed in a 50/50 solution of xylene/butyrolactone for about 4-7 minutes, followed by baking at 165° C. for 10 minutes. Consecutive films of Cr/Al/Cr/Cu/Au were evaporated on the resulting structure at 200° C. to a combined thickness of 16μ. The polyimide and the metal layers immediately above it were lifted-off by immersion in n-methylpyrrolidone at 80° C. for 1 hour.

What is claimed is:

1. A process for forming a pattern of conductive material on a processed semiconductor substrate, comprising the steps of:

applying a layer of photosensitive polyimide precursor to said substrate, wherein said precursor is a material which fully imidizes at a temperature in excess of the temperature at which said conductive material is to be applied, said layer having a thickness greater than about 15μ and at least about 25% greater than that of said film to be formed;

imagewise exposing and then developing said layer so as to uncover portions of said substrate;

applying a conductive material to form a film on the portions of said layer remaining on said substrate and the uncovered portions of said substrate at a temperature in the range from about 150° C. to about 250° C.; and lifting-off said remaining portions of said layer and the portions of said film which overlie said remaining portions of said layer.

2. The process of claim 1, wherein said photosensitive polyimide precursor material has the formula

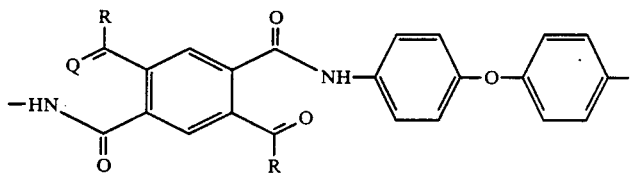

wherein R is

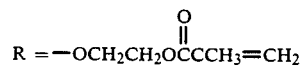

3. The process of claim 1, wherein said film of conductive material is formed at a temperature in the range from about 165° C., to about 200° C.

4. The process of claim 3, wherein said layer of photosensitive polyimide precursor has a thickness of about 15-30μ and said film of conductive material has a thickness of about 12-18μ.

5. A process for forming a pattern of metallization on a processed semiconductor substrate, comprising the steps of:
  applying a layer of photosensitive polyimide precursor to said substrate, wherein said precursor is a material which fully imidizes at a temperature in excess of the temperature at which metal is to be deposited, said layer having a thickness greater than about 15μ and at least about 25% greater than that of a metal film to be deposited;
  imagewise exposing said layer of photosensitive polyimide precursor;
  immersing said substrate in a developer so as to remove the unexposed portions of said layer and to uncover portions of said substrate;
  depositing a metal film on the portions of said layer remaining on said substrate and the uncovered portions of said substrate at a temperature in the range from about 150° C., to about 250° C.; and
  immersing said substrate in a solvent to lift-off said remaining portions of said layer and the portions of said metal film which overlie said remaining portions of said layer.

6. The process of claim 5, wherein said photosensitive polyimide precursor material has the formula

wherein R is $$R = -OCH_2CH_2O\overset{O}{\overset{\|}{C}}CCH_3=CH_2$$

7. The process of claim 6, wherein said metal film is formed at a temperature in the range from about 165° C., to about 200° C.

8. The process of claim 1, wherein said layer of photosensitive polyimide precursor has a thickness of about 15-30μ and said film of conductive material has a thickness of about 12-18μ.

9. The process of claim 8, wherein said solvent comprises n-methyl pyrrolidone.

10. The process of claim 1, wherein said photosensitive polyimide precursor fully imidizes at a temperature of at least about 250°-280° C.

* * * * *